United States Patent [19]
Becker

[11] Patent Number: 6,141,148
[45] Date of Patent: Oct. 31, 2000

[54] BIREFRINGENT PLATE ARRANGEMENT WITH STRESS BIREFRINGENCE

[75] Inventor: Jochen Becker, Oberkochen, Germany

[73] Assignee: Carl-Zeiss-Stiftung, Germany

[21] Appl. No.: 09/265,524

[22] Filed: Mar. 8, 1999

[30] Foreign Application Priority Data

Mar. 10, 1998 [DE] Germany .......................... 198 10 089

[51] Int. Cl.[7] .............................. G02B 27/28; G02B 5/30; G02B 6/00
[52] U.S. Cl. .......................... 359/500; 359/352; 359/494; 385/11
[58] Field of Search .................................... 359/352, 494, 359/500, 286, 819, 742, 743, 666; 385/11

[56] References Cited

U.S. PATENT DOCUMENTS

| | | | |
|---|---|---|---|
| 3,600,611 | 8/1971 | Treharne | 359/286 |
| 3,867,014 | 2/1975 | Kemp | 359/286 |
| 5,528,400 | 6/1996 | Arakawa | 349/117 |
| 5,566,023 | 10/1996 | Kley | 359/742 |
| 5,579,420 | 11/1996 | Fukushima | 385/11 |
| 5,625,427 | 4/1997 | Araujo et al. | 351/159 |

FOREIGN PATENT DOCUMENTS

| | | |
|---|---|---|
| 1174134 | 3/1959 | France . |
| 30 02 955 A1 | 1/1980 | Germany . |
| 02073215 | 9/1988 | Japan . |
| 06296051 | 10/1994 | Japan . |
| 1098897 | 1/1968 | United Kingdom . |

*Primary Examiner*—Cassandra Spyrou
*Assistant Examiner*—Jennifer Winstedt

[57] ABSTRACT

A birefringent plate arrangement with stress birefringence has pressure or shear shoe devices that engage on the sides of a birefringent plate. A plate with rectangular steps is provided for the round cross section of a pencil of light rays. The arrangement includes hydraulic transmission produced by weight force, and thermosymmetric construction.

8 Claims, 3 Drawing Sheets

BIREFRINGENT PLATE ARRANGEMENT WITH STRESS BIREFRINGENCE

CROSS-REFERENCE TO RELATED APPLICATIONS

Not applicable

STATEMENT REGARDING FEDERALLY SPONSORED RESEARCH OR DEVELOPMENT

Not applicable

REFERENCE TO A MICROFICHE APPENDIX

Not applicable

BACKGROUND OF THE INVENTION

1. Field of the Invention

This invention relates to a birefringent plate arrangement with stress birefringence.

2. Discussion of Relevant Art

It is known that stress birefringence can be produced by pressing or stretching an initially isotropic material.

Solid state lasers are polarized by laterally pressing the laser crystal. However, no quantitatively clean birefringence effect is produced thereby; a detuning of the resonator is sufficient.

In German Patent DE 196 37 563.0, not a prior publication, corresponding to U.S. patent application Ser. No. 08/929,913, an arrangement of the subject type with tensile stress is described. The use of pressure is rejected on constructional grounds, and if really necessary is provided as an addition, orthogonally to the tension. The content of the US Patent Application is incorporated herein by reference, since in particular the technical background and the importance of this invention can be well gathered from it.

SUMMARY OF THE INVENTION

The object of the invention is to provide a birefringent plate device with stress birefringence, having a very homogeneous stress birefringence in as large as possible a cross sectional portion with the smallest deformation, and which can be constructed to be compact, stable, and reliable in operation.

This is attained with a birefringent plate arrangement, in which pressure or shear devices engage at the sides of the birefringent plate.

Surprisingly, the inventor has found that the difficulty of bending under pressure that was still seen in German Patent DE 196 37 563 can be well controlled by careful design of the coupling of the glass plate to the pressure elements.

The pressure stresses and shearing stresses are then easier to apply to the suitable glass materials of the stress birefringence plate, since non-positive connection to pressure becomes possible without special shaping of the glass material.

It is particularly important that the dimensions of the arrangement by means of the stepped cross sectional shape of the plate according to an advantageous feature of the invention can be favorably matched to round mounts of round optical elements in the surroundings of the plate.

The hydraulic pressure transmission system according to advantageous features of the invention offers a very uniform introduction of stress. All fluids, liquid and gases, can be used as hydraulic media. Elastic envelopes for the hydraulic medium according to another advantageous feature of the invention, particularly hoses and membranes, give a simple, permanent, leak-free construction.

BRIEF DESCRIPTION OF THE DRAWINGS

The invention will be described in more detail with reference to the drawings, in which.

DETAILED DESCRIPTION OF PREFERRED EMBODIMENTS

Figure 1:
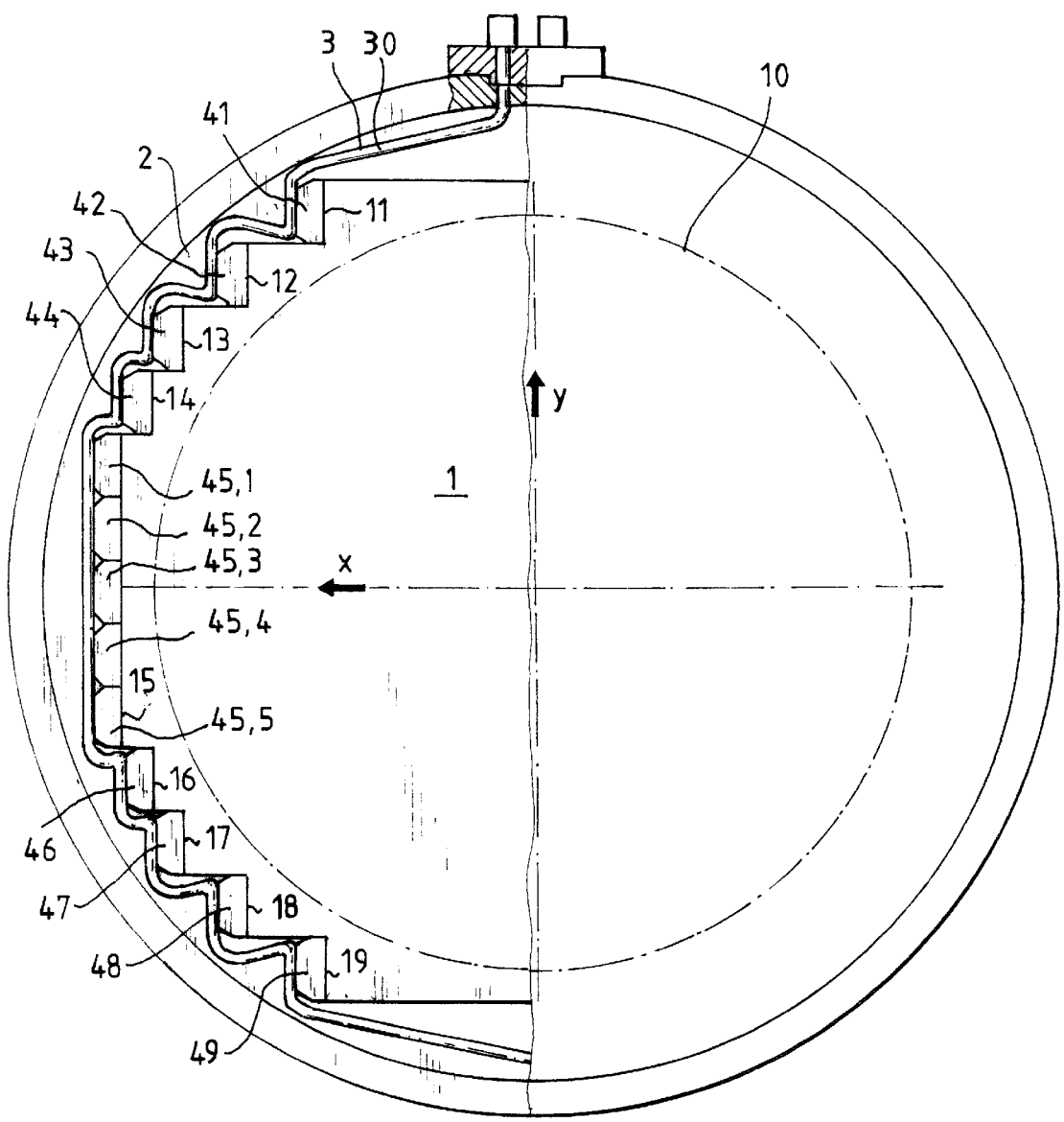
FIG. 1 shows a preferred embodiment with a stepped stress birefringent plate and hydraulic pressure introduction, partially in section.

FIG. 1 shows a stress birefringent plate 1 that can be used as a quarter wavelength plate in the deep ultraviolet region, for example, with the excimer laser line at 193 nm.

A free diameter of 240 mm for a pencil of light rays is obtained with an outer diameter of 330 mm of the device. The flat plate 1 consists of quartz glass with the qualities usually specified for microlithography in the DUV (deep ultraviolet) and has a thickness of only 6 mm. The thickness of the mount can then be limited to about 12 mm.

The shape of the quartz plate 1 is constituted as a rectangular step shape which encloses the circle or optical cross section (10) of the pencil of light rays, where each step 11–19 has equal width and is symmetric to the x-axis, and in the middle, several (here 5) steps are combined, at the same distance from the y-axis.

Figure 2:
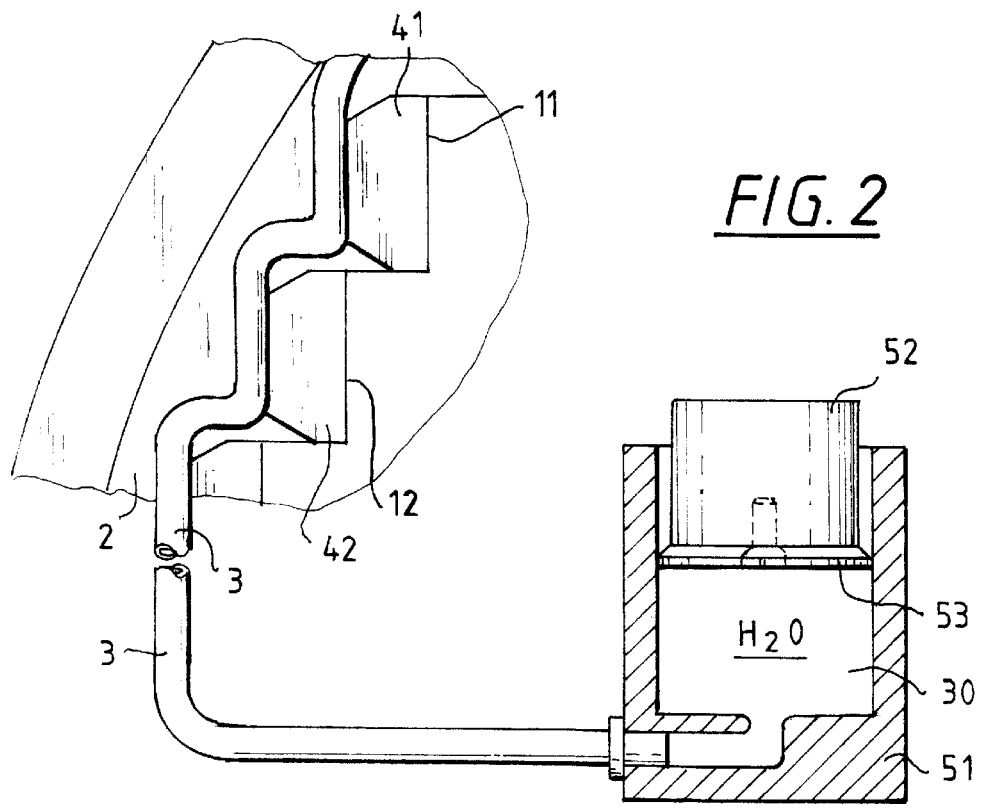
FIG. 2 shows schematically a detail of FIG. 1 and, schematically, the hydraulic pressure transmission system, in section.

The whole arrangement is mirror-image symmetrical to the y-axis (and also to the x-axis). FIG. 2 shows a partial detail view of this arrangement. All the step faces 11–19 parallel to the y-axis are very accurately flat and parallel. Pressure shoe devices 41–49 including 45.1–45.5 are set abutting on them. All are equal and have exactly parallel top surfaces. The top surfaces applied to the steps 11–19 have exactly the dimensions of the steps 11–19, in order to leave no gaps arising in the pressure introduction into the quartz glass plate 1.

The steps 11–19 and the abutting surfaces or faces of the pressure shoe devices 41–49 are finely etched, since uniform pressure transmission is optimized with such micro-roughness.

It is possible to compensate in advance for elastic deformation of the pressure shoe devices 41–49 under load, and thus to finish them with a curvature, so that the surfaces become flat under load.

The second top surface of the pressure shoe devices 41–49 abuts on an elastic hydraulic tube 3 that runs throughout and is filled with hydraulic fluid 30, preferably distilled water, and which is supported against abutment faces of the mounting ring 2. All the second top surfaces of the pressure shoe devices 41–49 are likewise equally large and are completely covered by the hydraulic tube 3. The surface is somewhat smaller than, and middle-centered with respect to the parallel top surfaces on the steps 11–19 of the glass plate 1.

The hydraulic fluid 30 is acted on with a predetermined pressure, preferably as schematically shown in FIG. 2, by means of a cylinder 51 with piston 52, the weight of which constitutes a force which determines the pressure. A seal 53 prevents loss of liquid.

The homogeneity of the pressure loading of the flat plate 1 is thus solely determined by the precision of the flat plate 1 with the steps 11–19 and of the pressure shoe devices 41–49. The magnitude of the pressure is determined solely by the weight of the piston 52 and the established geometric parameters, insofar as vibration or impact effects do not arise, which can be prevented very well in the surroundings of a microlithography system.

In particular, different thermal expansions of the parts—glass plate 1, metal mount 2, hydraulic fluid 30, and the like—cannot lead to pressure changes.

A quartz glass plate 1 of 6.00 mm thickness attains a birefringence that provides a phase displacement of lambda/4 at 193 nm, under a pressure in the plane of the plate of 1.618 N/mm$^2$.

This is attained, in the structure shown in FIG. 1, at a pressure of the hydraulic fluid 30 of about 20 bar.

These pressures are thus easily manageable. As the elastic hydraulic tube 3, a commercial tube of butyl rubber, with e.g. a diameter of 6.5 mm and a wall thickness of 0.3 mm, can be used. With water as the hydraulic fluid 30, there are no potential dangers that need to be mentioned.

The average bending of the quartz glass plate 1 under its own weight amounts to about 5 $\mu$m in the middle, when it is installed horizontally.

When the whole construction is faultlessly finished, the bending under operating pressure can be limited to a few micrometers. The risk mentioned earlier of impermissible buckling under pressure can thus be excluded.

The homogeneity of the birefringence in the quartz glass 1 can be ensured in the optical cross section 10 to under 5% deviation in amount and under 5% in angular deviation.

Alternatively, by constructions similar to that described in German Patent DE 196 37 563, plates can also be acted on homogeneously with pressure. Above all, attention is to be paid to prevent loading the glass plate with moments. A thermosymmetrical arrangement can be attained here as well by suitable combinations of material.

Besides the embodiments mentioned hereinabove, of a birefringent plate under pressure stress and that with pulling stress described in German Patent DE 196 37 563, embodiments with shear stress also have importance in that the same birefringent action is attained with forces half as large, necessarily applied in two mutually orthogonal directions. The bending under load is thus reduced, in principle, by up to a factor of ½.

Figure 3:
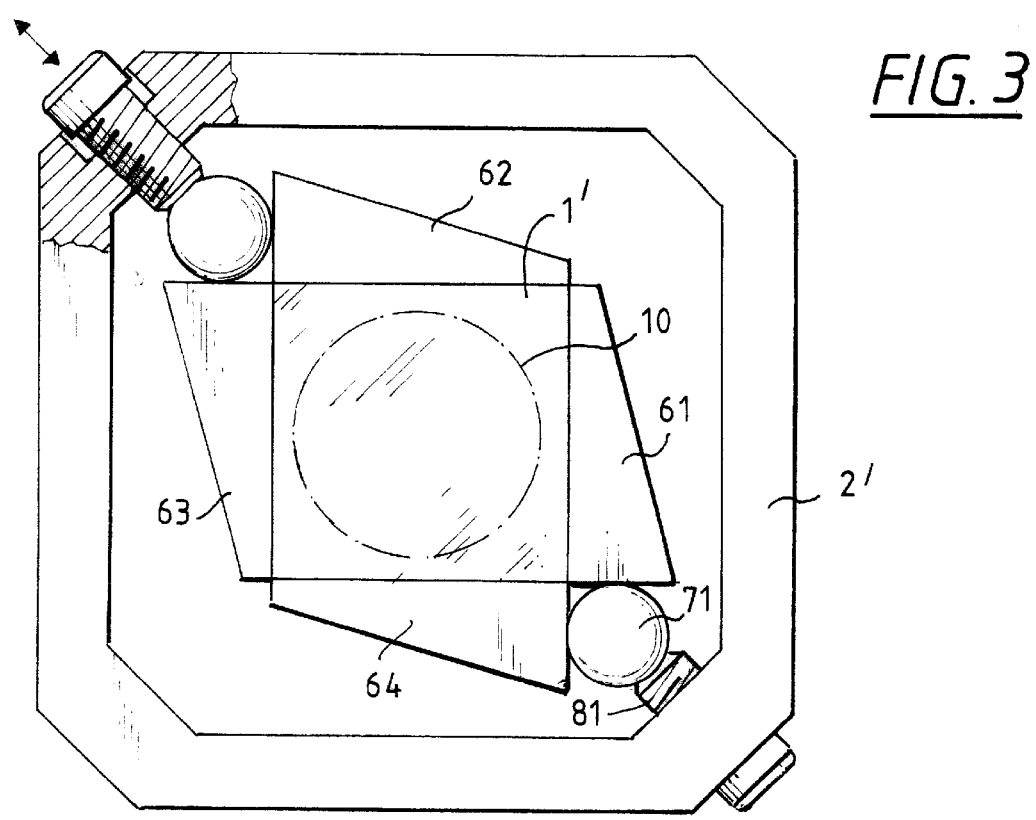
FIG. 3 shows a representation of the principles of an arrangement with shearing stress, partially in section.

FIG. 3 shows a construction for this purpose, in which rigid beams 61–64 are uniformly applied by force transmitting connection to the four sides of a square quartz glass plate 1' with the optically used cross section 10.

This assembly is clamped in a frame 2' by means of pressure balls 71 and pressure members 81 in a frame 2'. It is important that the beams 61–64 are substantially stiffer than the quartz plate 1', and they are therefore preferably made of hard metal. The force transmitting connection is attained by material connection, and in particular by soldering or cementing. The latter is suitable for less critical UV irradiation loading.

The pressure members 81 can be constituted as adjustable clamping means of known constructional types, and can also be arranged for thermosymmetrical disposition by suitable dimensioning and choice of materials.

Figure 4:
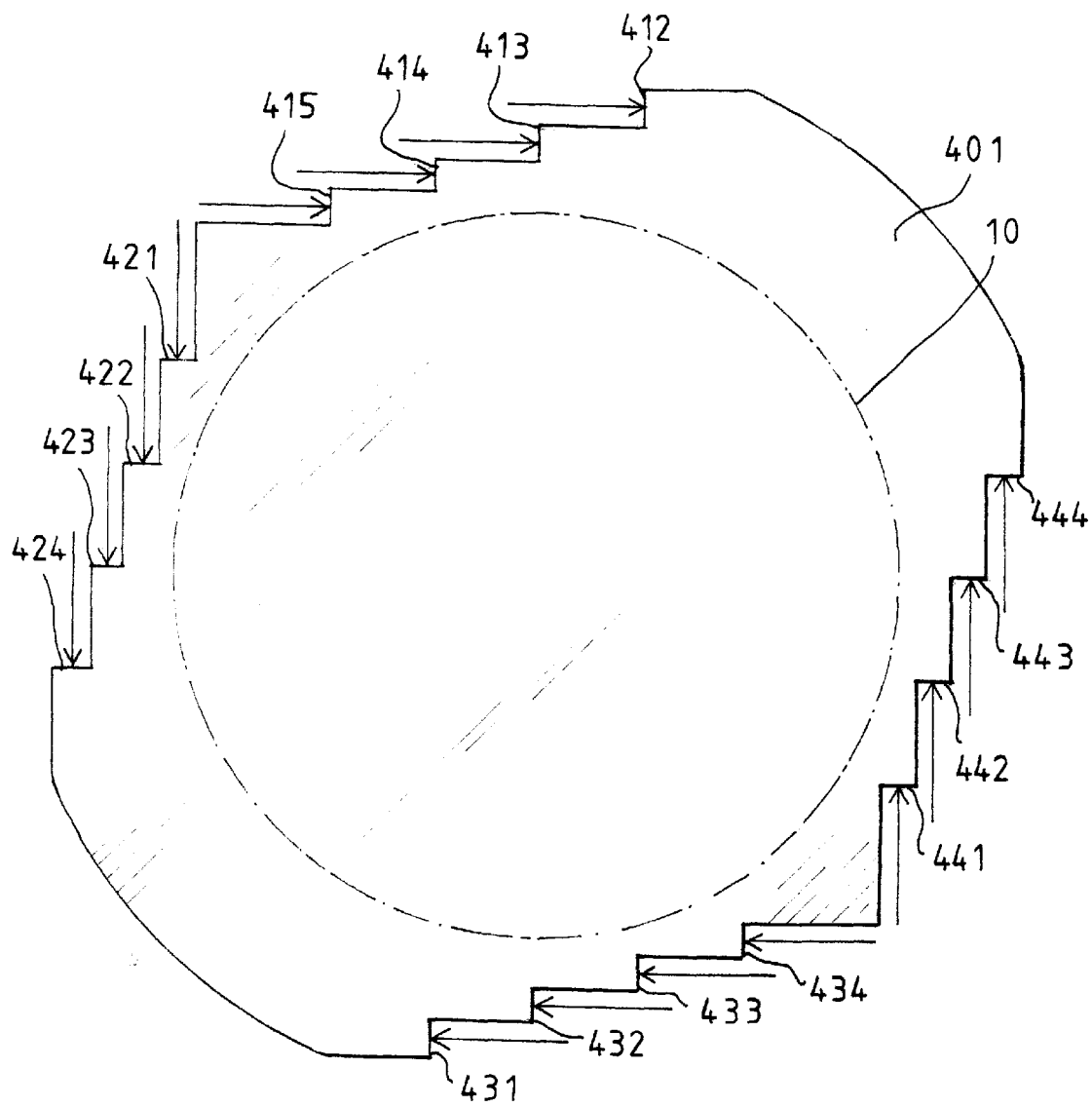
FIG. 4 shows another embodiment of a stepped, birefringent plate for the introduction of shearing stresses.

FIG. 4 shows a further embodiment of the invention. Here, no positive material connection is necessary for applying force to the quartz glass plate 401, and the external dimension of the structure is more closely matched to the useful diameter of the optical cross section 10.

For this purpose, the plate 1 has steps 412–415, 421–424, 431–434, 441–444, to which pressure is applied in the manner known from FIGS. 1 and 2. An approximation of the introduction of the shear forces corresponding to FIG. 3 can be attained to the required grade by selection of the number and width of the steps 412–444. All the advantages of the construction according to FIGS. 1 and 2 can thus be connected with the properties of the shearing stress.

The birefringent plates according to the invention are preferably embodied as plane-parallel plates. For compensating bending (under weight and stress) in advance, radii can be compensated. However, it is also possible to use other forms of plates, including prisms and lenses.

The application to the DUV region is particularly important in microlithographic optics and in measuring instruments, since the usual inexpensive birefringent elements and layers are not photo chemically suitable.

I claim:

1. A birefringent plate arrangement with stress birefringence, comprising:
   a plate (1) birefringent under stress, and
   pressure or shear devices (41–49) that engage at sides of said plate (1), wherein said plate (1) has an optical cross section (10) that is suitable for transmission of light, said plate has a shape that comprises rectangular steps (11–19) that approximate said optical cross section (10), and said pressure or shear devices (41–49) comprise a pressure shoe (41–49) on each of said rectangular steps (11–19), further comprising a hydraulic pressure transmission system (3) that acts on each said pressure shoe (41–49).

2. The birefringent plate arrangement according to claim 1, in which said plate (1) is a plane plate.

3. The birefringent plate arrangement according to claim 1, comprising about 4–25 rectangular steps (11–19).

4. The birefringent plate arrangement according to claim 1, in which said birefringent plate arrangement is a thermosymmetrical construction.

5. The birefringent plate arrangement according to claim 1, in which said pressure or shear devices (41–49) are arranged to introduce shearing stresses into said plate (1).

6. The birefringent plate arrangement according to claim 5, wherein said hydraulic transmission system includes a weight (52) that produces pressure in said hydraulic transmission system.

7. The birefringent plate according to claim 1, wherein said hydraulic transmission system includes a hydraulic medium (30) and an elastic envelope (3) for said hydraulic medium (30).

8. A birefringent plate arrangement with stress birefringence, comprising:
   a plate birefringent under stress with an optical cross section, and
   static pressure or shear devices that engage at sides of said plate over a full width of said optical cross section, causing a homogeneity of birefringence in said optical cross section of under 5% deviation in amount and under 5% in angular deviation,
   wherein said optical cross section is suitable for transmission of light, said plate has a shape that comprises rectangular steps that approximate said optical cross section, and said pressure or shear devices comprise a pressure shoe on each of said rectangular steps,
   further comprising a hydraulic pressure transmission system that acts on each said pressure shoe.

* * * * *